United States Patent [19]

Biron

[11] Patent Number: 5,306,874
[45] Date of Patent: Apr. 26, 1994

[54] ELECTRICAL INTERCONNECT AND METHOD OF ITS MANUFACTURE

[75] Inventor: Richard M. Biron, Melbourne, Fla.

[73] Assignee: W.I.T. Inc., Melbourne, Fla.

[21] Appl. No.: 728,978

[22] Filed: Jul. 12, 1991

[51] Int. Cl.$^5$ ............................................ H05K 01/00
[52] U.S. Cl. ...................................... 174/262; 174/254
[58] Field of Search .................... 361/397, 401, 403; 174/72 B, 103, 250, 251, 253, 254, 264, 262; 439/61, 60, 59

[56] References Cited

U.S. PATENT DOCUMENTS

| | | | |
|---|---|---|---|
| 2,994,058 | 7/1961 | Dahlgren | 339/100 |
| 3,004,237 | 10/1961 | Cole et al. | 339/176 |
| 3,221,286 | 11/1965 | Fedde | 339/17 |
| 3,258,831 | 7/1966 | Angele et al. | 29/155.55 |
| 3,382,572 | 5/1968 | Crawford et al. | 29/604 |
| 3,399,452 | 9/1968 | Reid | 29/629 |
| 3,585,455 | 6/1971 | Naylor . | |
| 3,601,755 | 8/1971 | Shiells | 339/19 |
| 3,740,693 | 6/1973 | Gorman . | |
| 3,744,128 | 7/1973 | Fisher et al. | 29/629 |
| 3,913,224 | 10/1975 | Preissinger et al. . | |
| 3,920,301 | 11/1975 | Roberts et al. | 339/17 F |
| 4,044,022 | 12/1977 | Morris et al. | 29/625 |
| 4,085,502 | 4/1978 | Ostman et al. | 29/629 |
| 4,187,606 | 2/1980 | Sinclair | 29/629 |
| 4,188,714 | 2/1980 | Jean | 29/628 |
| 4,401,844 | 8/1983 | Fleuret . | |
| 4,532,152 | 7/1985 | Elarde . | |
| 4,827,328 | 5/1989 | Ozawa et al. . | |
| 4,835,394 | 5/1989 | Steele . | |
| 5,029,242 | 7/1991 | Sammet . | |
| 5,051,542 | 9/1991 | Hernandez . | |
| 5,120,257 | 6/1992 | Hahn . | |

Primary Examiner—Leo P. Picard
Assistant Examiner—Cheryl R. Figlin
Attorney, Agent, or Firm—Evenson, Wands, Edwards Lenahan & McKeown

[57] ABSTRACT

In order to form a (flexible) electrical interconnect structure a flexible dielectric substrate having a plurality of windows is laminated between a first, relatively thin flexible conductor layer and a second, relatively thick conductor layer. The first flexible conductor layer is pattened into a plurality of flexible conductor lines. The second conductor layer is patterned into first and second pluralities of spaced apart terminals, which overlie the windows. Conductive vias are formed through the flexible dielectric substrate between the terminals and the flexible conductor lines, thereby connecting the terminals on one side of the flexible substrate to the flexible conductor lines on the other side of the substrate.

25 Claims, 7 Drawing Sheets

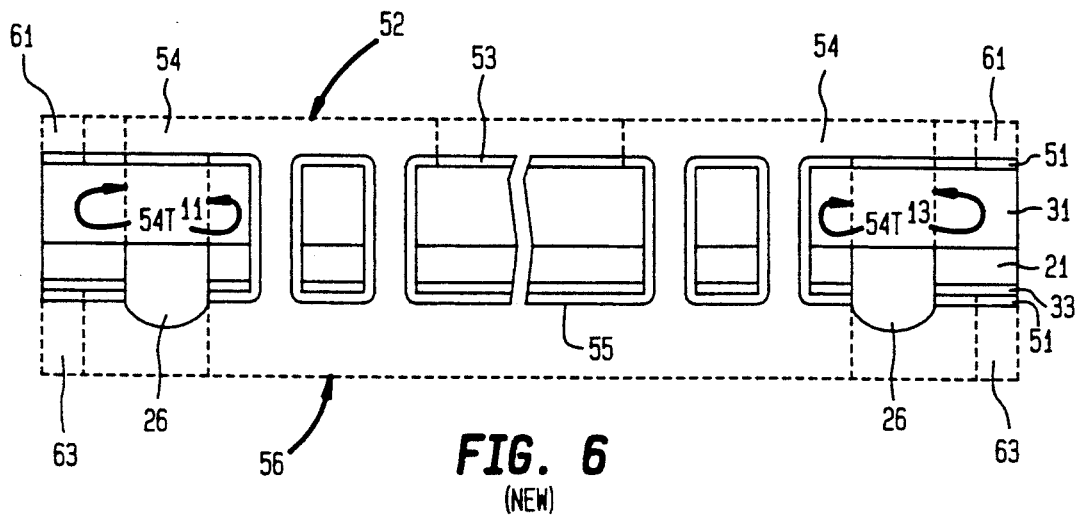
FIG. 6
(NEW)

ELECTRICAL INTERCONNECT AND METHOD OF ITS MANUFACTURE

FIELD OF THE INVENTION

The present invention relates in general to electrical interconnect structures, e.g. flexible, multiconductor printed circuit jumper cables, and is particularly directed to an improved interconnect structure and a process for manufacturing such a structure.

BACKGROUND OF THE INVENTION

As the micro-miniaturization of electrical and electronic circuit components has continued to reduce the size and spacing of packaged devices it has been necessary to provide increased precision interconnect structures, including those that are both flexible and robust. Typically, such structures comprise a compliant layer of patterned metal embedded in a (flexible) dielectric (ribbon) body. Opposite ends of the metal layer are either joined with or built up to an increased size and strength, and configured for attachment to electrical terminals of one or more circuit packages. Because of the wide variety of terminal connectors with which such interconnect structures may be used, the end terminals of such cables ca; be expected to have a comparable variety of shapes and sizes, which has resulted in a profusion of custom designed printed circuit interconnect structures.

One example of such a conventional (flexible) interconnect structure is described in U.S. Pat. No. 4,085,502 to Ostman et al, entitled "Jumper Cable". In accordance with the patented configuration, the thickness of a prescribed region of interconnect metal intermediate its opposite ends is selectively reduced or 'sculptured' (as by milling), etched into separate tracks, and then sandwiched between a pair of flexible dielectric layers. Because the thickness of the intermediate portion of the resulting laminate structure is reduced relative to the thickness of its opposite ends, the intermediate portion is able to flex. Conversely, the thicker end portions provide rigid terminations for the respective ends of the jumper cable.

A fundamental shortcoming of the sculptured approach to the manufacture of interconnect structures is the fact that the milling or etching of the metal makes sculpturing process-intensive and limits the degree to which the intermediate portion of the metal can be 'thinned', in order to make it flexible, without creating the potential for discontinuities. Selective chemical milling of the metal can lead to undercuts at regions immediately adjacent to the thicker end mesa regions.

Unfortunately, other interconnect cable configurations and processing methodologies are either similarly complex or limit the degree to which the cable terminations can be tailored with respect to configuration, size and materials.

SUMMARY OF THE INVENTION

In accordance with the present invention, the above-mentioned shortcomings of conventional interconnect structures, particularly the sculptured approach, are obviated by a new and improved electrical interconnect structure and a method of forming such a improved structure, which permits the interconnect metal to be precisely formed to extremely thin tracks, for improved flexibility, while providing rigid terminations at the ends of the tracks which have a size and shape that are definable exclusive of the patterning of the compliant metal tracks.

To this end, a first conductor (metal) layer of a desired thinness, e.g. a metallic foil layer for improved flexibility, is formed on a first surface of a dielectric substrate and selectively patterned into a plurality of conductor lines that extend between first and second locations of said first surface of the dielectric substrate adjacent to respective opposite end edges of the substrate. A second conductor layer that has been formed on a second surface of the flexible dielectric substrate is patterned into respective pluralities of terminal connectors at opposite ends of the jumper cable. First ones of the patterned terminal connectors extend from first locations of the second surface of the substrate adjacent to the first edge and overlie the first locations of the first surface of the substrate. Second ones of the patterned terminal connectors extend from second locations of the second surface of the substrate adjacent to the second edge and overlie the second locations of the first surface of the substrate.

A first plurality of vias are formed through the first plurality of terminal connectors and the flexible conductor lines. Conductive material is formed in the first plurality of vias using a conventional plating process, in order to conductively join the first terminal connectors to one end of the conductor lines. Similarly, a second plurality of vias are formed through the second locations of the substrate between respective ones of the second terminals and the flexible conductor lines. Conductive material is formed in the second plurality of vias to conductively join the second terminal connectors to the other, opposite ends of the conductor lines. Thus, terminal connectors of the requisite size and customized shape are able to be formed on one surface of he dielectric ribbon independently of the formation of the thin conductor tracks that have been selectively formed on the opposite surface of the substrate. Between the terminal connectors the cable comprises a thin layer of (flexible) dielectric and a thin, compliant metal track layer, thereby imparting the desired flex-interconnect functionality, while the ends of the cable have sturdy terminal connectors that are configured for attachment to circuit device package terminals.

BRIEF DESCRIPTION OF THE DRAWINGS

FIGS. 1–6, 6A, 6B, 7–13, 13A and 14–17 are cross-sectional and plan views of the jumper cable in accordance with the present invention at successive stages of its manufacture.

DETAILED DESCRIPTION

Figure 1:
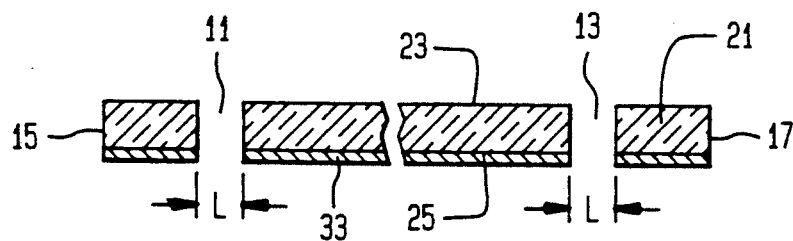
Figure 2:
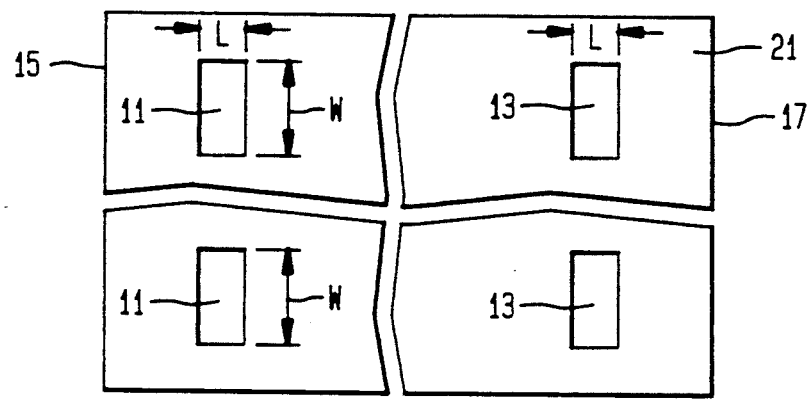

Referring now to FIGS. 1–6, 6A, 6B, 7–13, 13A and 14–17, which show the configuration of the jumper cable in accordance with a preferred embodiment of the present invention at successive stages of its manufacture, the process begins with the selective formation of one or more pairs of generally rectangularly shaped windows 11, 13 through a laminate structure of a thin dielectric substrate 21 and a thin, cladding metal layer 33 formed on the bottom surface of the substrate. Windows 11 and 13 may be formed by means of a die punch, for example, and are located adjacent to respective opposite edges 15, 17 of substrate 21, as shown in FIGS. 1 and 2. Substrate 21 may comprise any material customarily employed for interconnect and printed circuit applications, such as duPont Kapton or FR4. For flexibility, the thickness of substrate 21 is preferably on the order of one to three mils, although other thicknesses of dielectric may be used depending upon the material employed and the degree of flexibility desired Windows 11 and 13 extend completely through metal cladding layer 33, and between a top surface 23 and bottom surface 25 of substrate 21. The with W of the window, is sufficient to span the overall width of a set of conductor tracks and a window length L is sufficient to accommodate the formation of through holes, as will be described in detail below.

Figure 3:
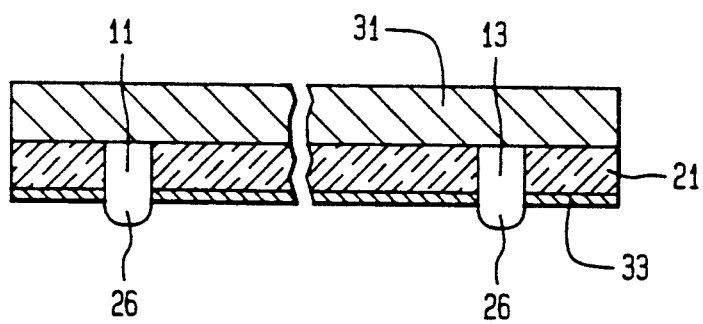

After the formation of the windows in the laminate metal layer 33 and dielectric substrate 21, a thin adhesive layer may be applied to surface 23 and a conductor layer 31 bonded to the top surface of substrate 21, so as to form a three layer laminate structure, as shown in FIG. 3. In this structure, a conductor layer 31, which iu to serve as the base metal of the end connector terminal of the jumper cable, may comprise a relatively hard (e.g. six or eight ounce) sheet of beryllium-copper. The thickness of first conductor layer 31 will depend upon the final size of the connectors to be formed from layer 31. Materials other than beryllium-copper may be employed depending upon desired rigidity and toughness of the terminal connectors. The thin cladding layer 33, which is formed on bottom surface 25 of dielectric substrate 21 and is to serve as the conductor lines of the flexible interconnect between the terminal connectors of the interconnect structure may comprise a layer of soft copper, such as one or two ounce copper. The thickness used will depend upon the flexibility and current carrying capacity desired. Prior to the formation of through holes, a layer of photoresist, shown at 26 in FIG. 3, is formed at the bottom surface in the laminate structure so as to protect the bottom surface 32 of conductive layer 31, exposed by windows, 11, 13, during subsequent processing.

Figure 4:
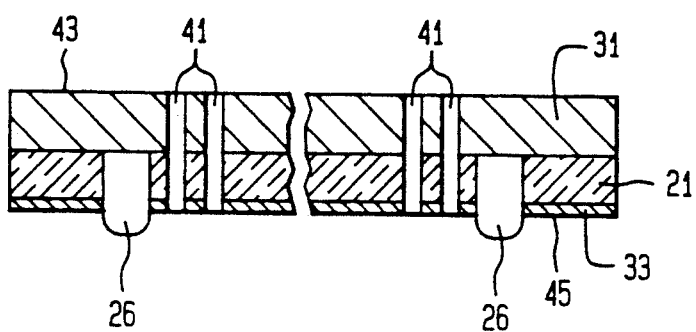
Figure 5:
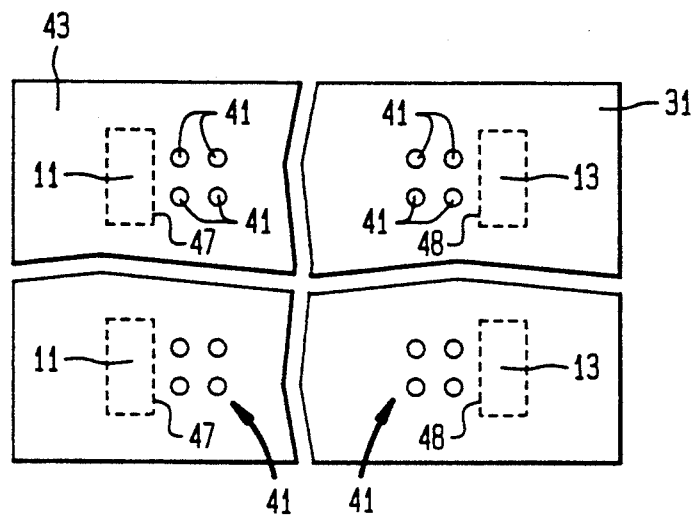

Next, as shown in FIGS. 4 and 5, sets of through holes 41 which, when plated or otherwise filled with conductive material provide interconnects between the terminals and the thin flexible tracks, are formed, for example by drilling, through the laminate structure so as to extend from the top surface 43 of thick conductor layer 31 to the bottom surface 45 of thin conductor layer 33. As shown in FIG. 5, through holes 41 are drilled at locations immediately adjacent to &he interior edges 47, 48 of windows 11, 15. While only one through hole is required at each end, preferably, a plurality (e.g. two) through holes are drilled at respective spaced apart portions of thin conductor layer 33 where conductor tracks are to be electrically joined with respective terminal connectors, in order to provide a robust electrical interconnect through the flexible substrate 21, thus assuring compliance with specifications for reliability under severe operating conditions.

Through holes 41 then cleaned for example by means of a plasma etch, and then sensitized by electroless plating of a thin copper layer, typically fifty millionths of an inch thick, to provide a plating base layer for subsequent electrolytic deposition of a conductive layer (e.g. copper) on dielectric substrate 21.

A relatively thick copper layer 51 (e.g. several ounces of copper) is then electroplated (selectively or non-selectively) on opposite surfaces 43 and 45 of the laminate structure, and sensitized through holes 41, to interconnect thick copper layer 1 with thin copper layer 33, as shown in FIG. 6.

Figure 7:
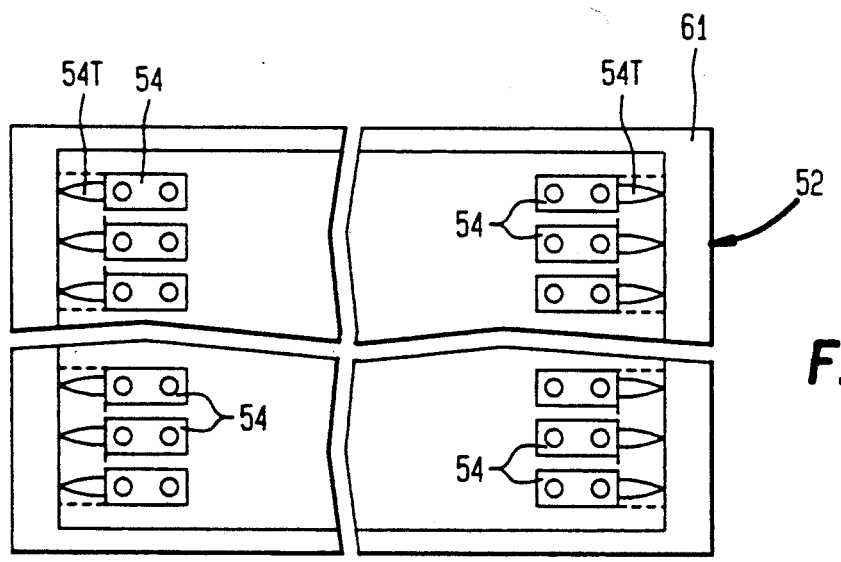
Figure 6A:
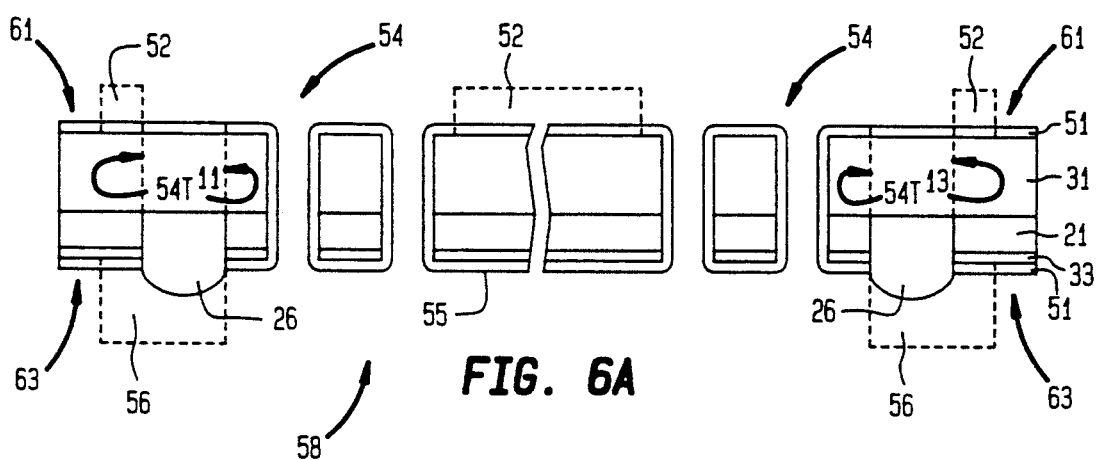
Figure 6B:
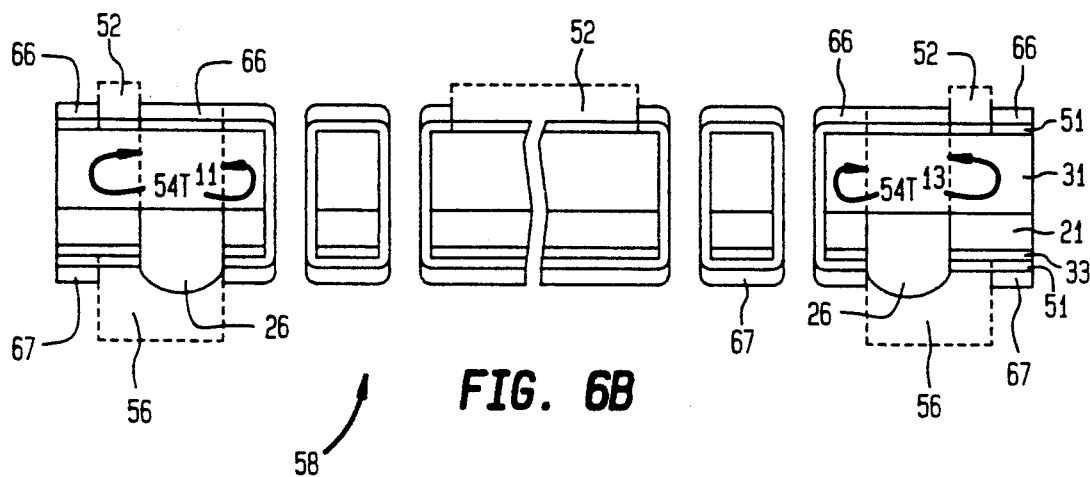
Figure 8:
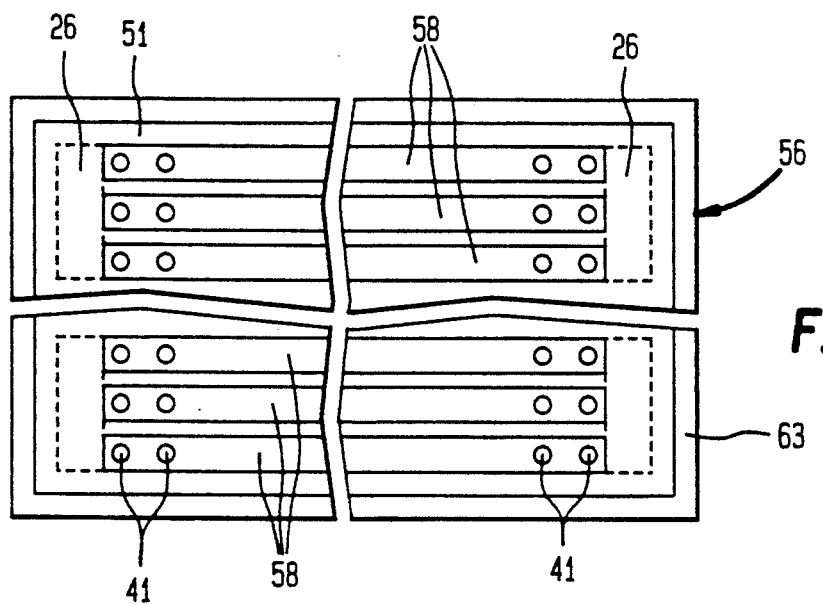
Figure 9:
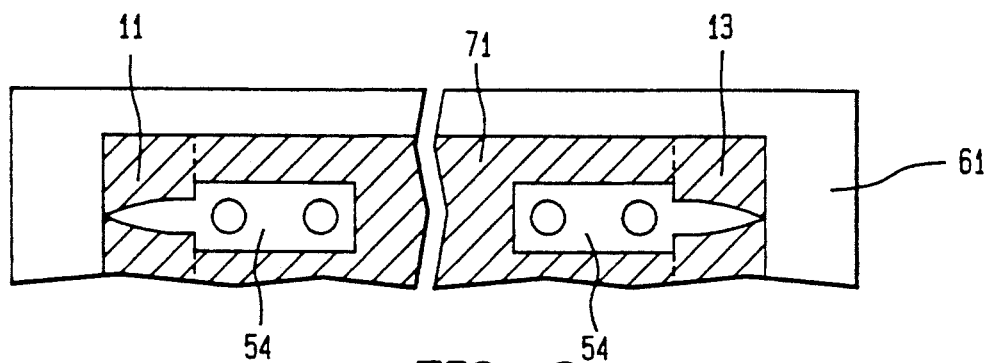
Figure 10:
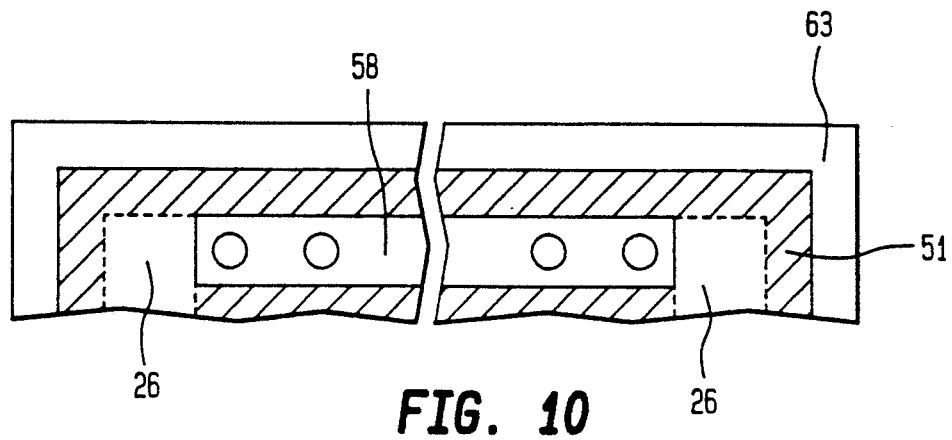

Following the electroplate of copper layer 51, a first etching mask of photoresist material 52, corresponding to the intended shape of the terminal connectors 54, is imaged and developed or the top surface 53 of copper layer 51, as shown in dotted lines in FIG. 6 and also shown in FIG. 7. As shown in FIG. 7, each terminal connector 54 has a reduced width or narrow 'tongue' portion 54T that overlies a respective one of windows 11, 13. The length of 'tongue' portion 54 coincides with the width of a window and is delineated by dotted lines 54T 11 and 54T 13. A second etching mask 56 of photoresist material, corresponding to the intended pattern of the flexible interconnect tracks 58, is selectively formed on the bottom surface 55 of copper layer 51, as shown by clothes lines in FIG. 6 and shown in FIG. 8. In addition to defining the intended shapes of the terminal connectors 54 and interconnect tracks 58, the respective masks also include a border or frame pattern, as shown at 61 in FIGS. 6 and 7 and 63 in FIGS. 6 and 8. The soluble photoresist material defining the configurations of the terminal connectors 54 and interconnect tracks 58 is then removed by a suitable photoresist wash, exposing respective terminal (54) and track-shaped portions of underlying copper layer 51, as well as their border regions 61, 63, as shown in FIG. 6A. Next, as shown in FIG. 6B, respective layers of solder material 66, 67 which resist copper etchant then applied to the exposed surfaces 53, 55 of copper layer 51. The remaining portions of photoresist masks 52, 56 are then stripped off, exposing those portions 71, 72 of the underlying copper layer 51 that is not masked by solder material, as shown in the top and bottom views of FIGS. 9 and 10.

Figure 11:
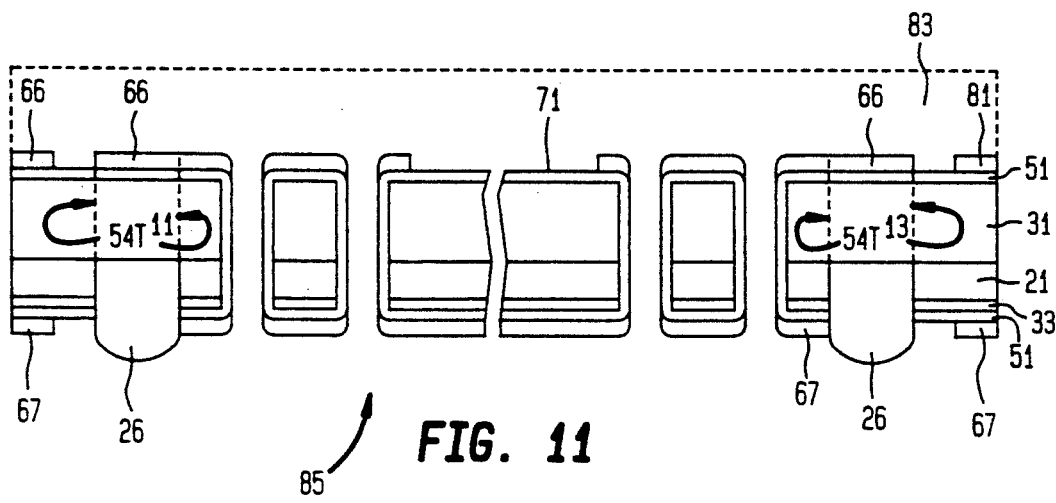
Figure 12:
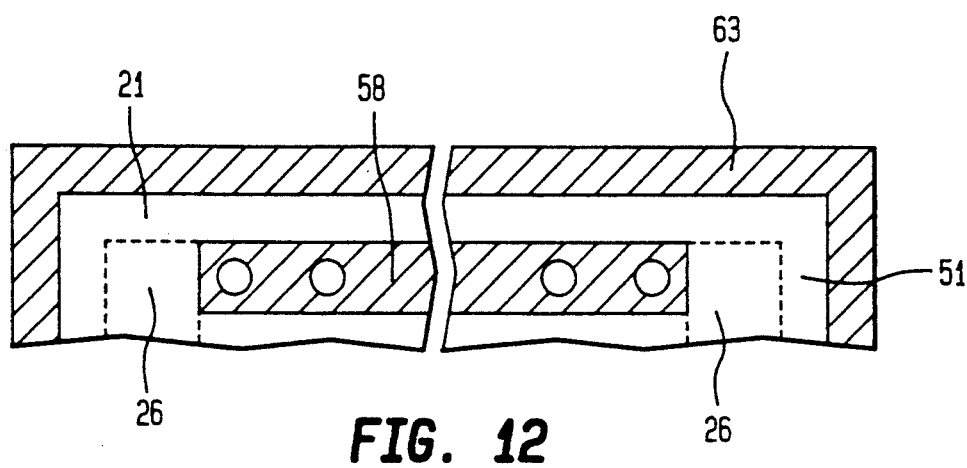

Next, as shown in the cross-sectional illustration of FIG. 11, the top side 81 of the laminate structure, including solder built up regions 54 and exposed portions 71 of the top surface 53 of copper layer 51, is refilmed with a layer of photoresist 83, while the bottom side 85 remains uprotected. A copper wash is then applied to the unprotected bottom side 85, thereby etching away the exposed copper layer 51 not masked by solder material 67, which coincides with track 58, leaving a solder covered-conductor pattern of interconnect tracks 58 and border pattern 63, as shown in FIG. 12. The resist layer 83 on the top side 81 of the laminate structure is then stripped off.

Figure 13:
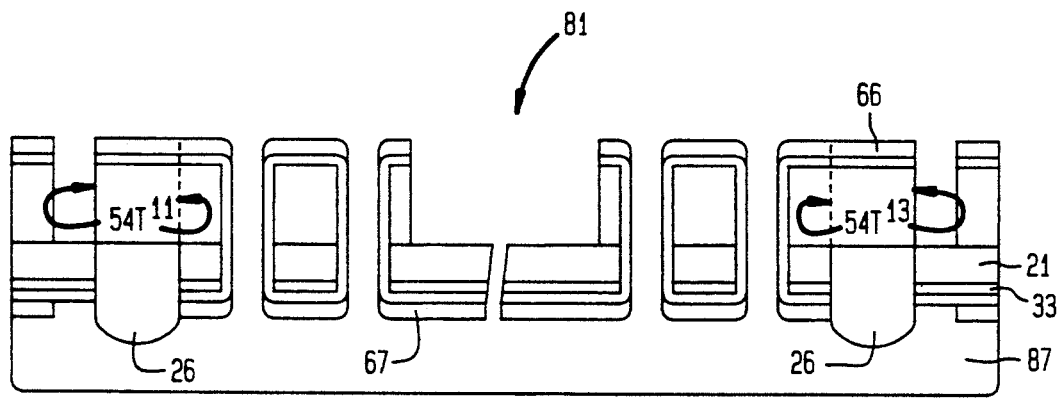
Figure 14:
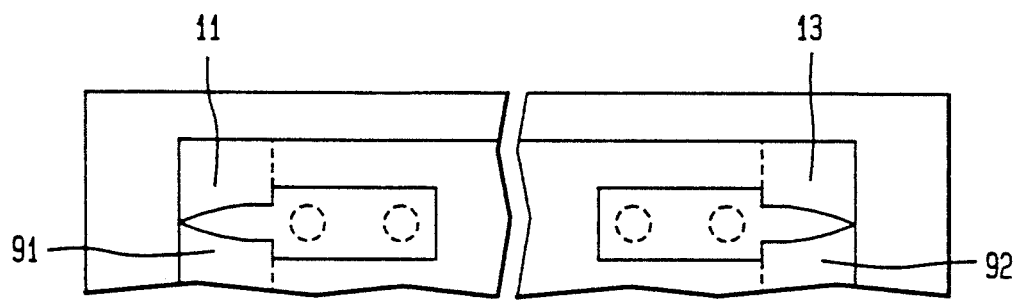

As shown in FIG. 13, the bottom side 85 is then is non-selectively refilmed with a photoresist layer 87, leaving the top side 81 unprotected. A copper wash is then applied to the unprotected top side 81, thereby etching away the exposed surface of copper layer 51 and beryllium copper layer 31 not covered by protective solder layer 66. This copper wash step leaves a solder-covered conductor pattern of terminal connectors 54 and border pattern 61, and exposing those portions 91, 92 of windows 11, 13, respectively, not covered by 'tongue' portions terminal connectors 54, as shown in FIG. 14.

Figure 13A:
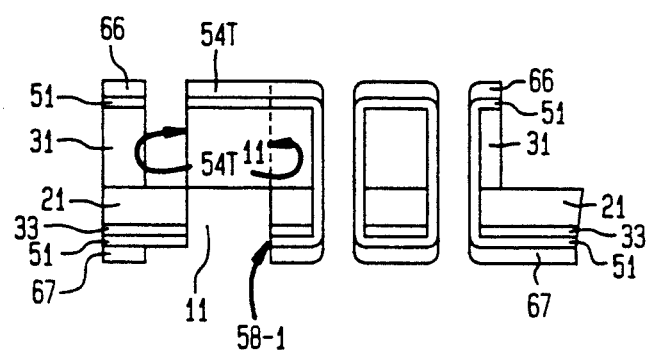
Figure 15:
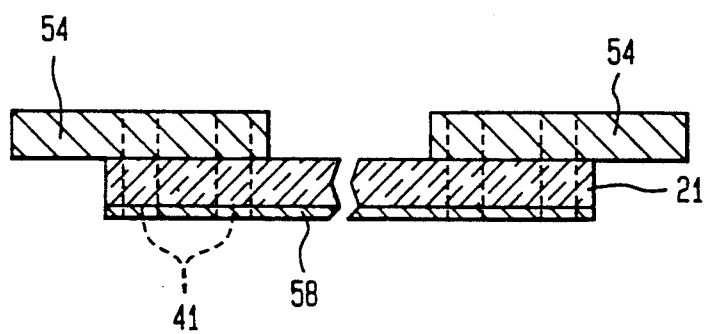
Figure 16:
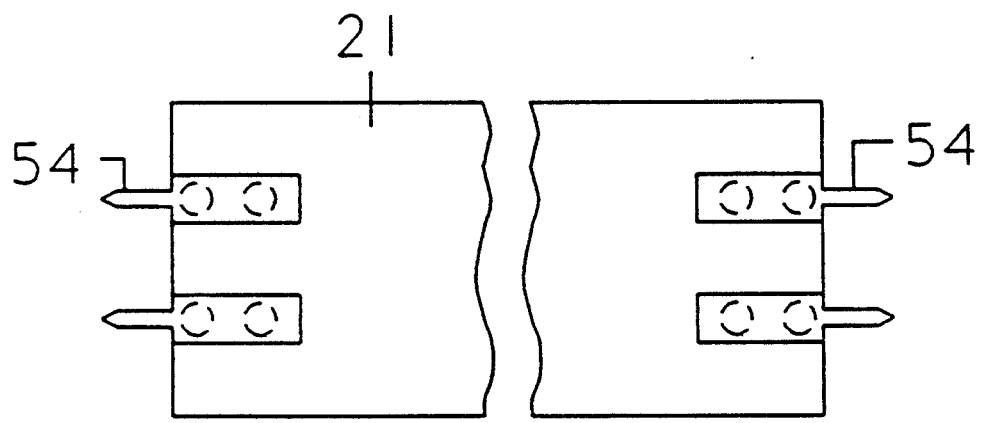
Figure 17:
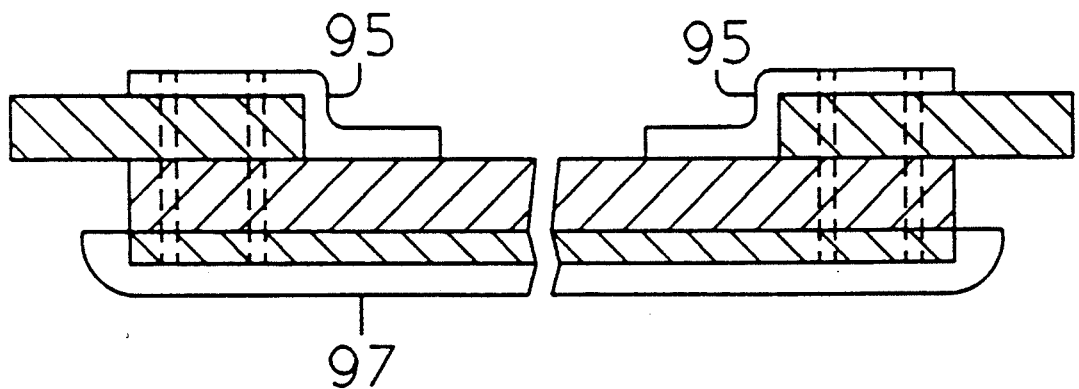

Photoresist layer 87 and the photoresist materials are then stripped off the bottom side 85, to leave a structure as shown in the side view of FIG. 13A. It will be noted that a forward edge 58-1 of a track 58 is coincident with an edge of window 11. Similarly, except for tongue portion 54T of the relatively thick terminal conductor portion 54, the remainder of the top-side copper, including beryllium copper layer 31, is etched away by the copper wash, leaving terminal conductors 54 at opposite ends of the top of the dielectric substrate 21. These terminal conductors are connected to the tracks 58 on the bottom surface of the dielectric substrate by the plated through holes 41, as described above. Because edges of the windows define ends of the terminal connectors, extraneous material beyond the edges of the windows is readily broken away to leave the structure shown in FIG. 15. The solder overlay is etched off the protected portions of copper layer 51, and the border is trimmed, leaving a jumper cable configuration, as shown in FIGS. 15 and 16. Because of the plated through holes 41, terminal connectors 54 are conductively connected through the dielectric substrate with opposite end portions of the flexible tracks 58.

Where it is desirable to provide insulative protection for the patterned metal, insulating material may be selectively formed on one or both surfaces of the jumper cable structure, partially or fully protecting the patterned metal and plated through holes as shown at 95 and 97 in FIG. 17. Finish plating, (i.e., Bright, Tin or Gold) is then plated on the border, the interconnects and the terminations.

As will be appreciated from the foregoing description, the shortcomings of conventional jumper cable structures, 1 particularly those employing sculpture-processing of thick conductor layers to form both flexible interconnect lines and rigid terminations, are obviated by the structure and processing methodology of the present invention, which permits the interconnect interconnect metal to be precisely formed into extremely thin tracks for improved flexibility, while providing rigid terminations at the ends of the track having a size and shape that are definable exclusive of the patterning of the compliant interconnect metal.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. An electrical interconnect structure comprising:
   a dielectric sheet having at least one first through hole passing through said sheet between first and second surfaces thereof adjacent to a first edge of said sheet and at least one second through hole passing through said sheet between said first and second surfaces adjacent to a second edge of said sheet;
   a conductive layer formed on said first surface of said sheet and extending from a first position thereof which overlaps said at least one first through hole to a second portion thereof which overlaps said at least one second through hole;
   a first terminal conductor formed on a first portion of said second surface of said sheet overlapping said first through hole and extending beyond said first edge of said sheet;
   a second terminal conductor formed on a second portion of said second surface of said sheet overlapping said second through hole and extending beyond said second edge of said sheet;
   first conductive material formed in said at least one first through hole and conductively connecting said first terminal conductor to a first portion of said conductor layer overlapping said first through hole; and
   second conductive material formed in said at least one second through hole and conductively connecting said second terminal conductor to a second portion of said conductor layer overlapping said second through hole.

2. An electrical interconnect structure according to claim 1, wherein said dielectric sheet and the conductive layer formed on the first surface of said dielectric sheet are flexible.

3. A printed circuit structure comprising:
   a first printed circuit pattern formed on a first surface of an insulating layer, said first printed circuit pattern containing material desirable for and being configured in the shape of terminal connectors which project beyond edges of said insulating layer;
   a second printed circuit pattern formed on a second surface of said insulating layer, said second printed circuit pattern containing material desirable for and being configured in the shape of conductor lines which extend across said second surface between the edges of said insulating layer;
   through holes extending through the terminal connectors and conductor lines of said first and second printed circuit patterns, respectively, and through said insulating layer therebetween; and
   conductive material in said through holes electrically interconnecting said first and second printed circuit patterns.

4. A printed circuit structure according to claim 3, wherein said insulating material is flexible and said second printed circuit pattern is formed of relatively thin, flexible conductor material and said first printed circuit pattern is formed of relatively thick conductor material having sufficient rigidity and toughness for use as terminal connectors.

5. A printed circuit structure according to claim 4, wherein said thin, flexible conductor material comprises soft copper and said thick conductor material comprises beryllium copper.

6. A printed circuit structure according to claim 5, wherein the conductive material in said through holes comprises plated conductor material.

7. A flexible printed circuit structure comprising:
   a first, relatively thick printed circuit metallic pattern selectively formed on a first surface of a flexible dielectric layer, said first printed circuit pattern containing metal configured in the shape of terminal connectors having substantial rigidity which project beyond edges of said flexible dielectric layer;
   a second, relatively thin, flexible printed circuit metallic pattern selectively formed on a second surface of said flexible dielectric layer, said second printed circuit pattern containing metal configured in the shape of conductor lines which extend across said second surface between the edges of said flexible dielectric layer; and
   conductive vias extending through the terminal connectors L and conductor lines of said first and second printed circuit patterns, respectively, and through said insulating layer therebetween, and electrically interconnecting said first and second printed circuit metallic patterns.

8. A flexible printed circuit structure according to claim 7, wherein said relatively thin, flexible metal comprises soft copper and said relatively thick metal comprises beryllium copper.

9. An electrical interconnect structure comprising:
a dielectric sheet having a plurality of first through holes passing through said sheet between first and second surfaces thereof adjacent to a first edge portion of said sheet and a plurality of second through holes passing through said sheet between said first and second surfaces adjacent to a second edge portion of said sheet;
a plurality of conductor layers formed on said first surface of said sheet and extending from a first portion thereof which overlaps said plurality of first through holes to a second portion thereof which overlaps said plurality of second through holes;
a plurality of first terminal conductors formed on a first portion of said second surface of said sheet overlapping respective ones of said plurality of first through holes and extending beyond said first edge of said sheet;
a plurality of second terminal conductors formed on a second portion of said second surface of said sheet overlapping respective ones of said plurality of second through holes and extending beyond said second edge of said sheet;
conductive material formed in aid plurality of first through holes conductively connecting said first terminal conductors to first portions of said conductor layers overlapping said first through holes; and
conductive material formed in said plurality of second through holes conductively connecting said second terminal conductors to second portions of said conductor layers overlapping said second through holes.

10. An electrical interconnect structure according to claim 9, wherein said dielectric sheet and aid conductor layers are flexible.

11. A flexible electrical interconnect structure according to claim 10, wherein flexible conductor layers comprise soft copper and terminal conductors comprise beryllium copper.

12. A method of manufacturing an electrical interconnect structure comprising the steps of:
(a) selectively patterning a first conductor layer on a first surface of a dielectric substrate into a plurality of conductor lines extending between first and second locations of said first surface of said flexible dielectric substrate adjacent to respective first and second edges thereof;
(b) selectively patterning a second conductor layer on a second surface of said dielectric substrate into a first plurality of terminals, respective ones of which extend from first locations of said second surface of said dielectric substrate adjacent to said first edge hereof and overlying the first locations of said first surface of said dielectric substrate, and into a second plurality of terminals, respective ones of which extend from second locations of said second surface of said dielectric substrate adjacent to said second edge thereof and overlying the second locations of said first surface of said dielectric substrate;
(c) providing a first plurality of conductive vias through said dielectric substrate between respective ones of said first terminals and said conductor lines; and
(d) providing a second plurality of conductive vias through said dielectric substrate between respective ones of said second terminals and said conductor lines.

13. A method according to claim 12, wherein said first conductor layer and said dielectric substrate are flexible.

14. A method of manufacturing an electrical interconnect structure comprising the steps of:
(a) providing a dielectric substrate having a plurality of windows therethrough at spaced apart portions thereof;
(b) forming a first, relatively thin conductor layer on a first surface of said dielectric substrate, such that material of said first conductor layer extends between said windows;
(c) forming a second, relatively thick conductor layer on a second surface of said dielectric substrate, such that said second conductor layer overlies said windows;
(d) selectively patterning said first conductor layer into a plurality of conductor lines extending between first and second locations of said first surface of said dielectric substrate adjacent to edges of spaced apart windows;
(e) selectively patterning said second conductor layer into a first plurality of terminals, respective ones of which extend from first locations of said second surface of said dielectric substrate adjacent to a first edge portion thereof and overlying the first locations of said first surface of said dielectric substrate, and into a second plurality terminals, respective ones of which extend from second locations cf said second surface of said dielectric substrate adjacent to a second edge portion thereof and overlying the second locations of said first surface of said dielectric substrate
(f) providing a first plurality of conductive vias through said dielectric substrate between respective ones of said first terminals and said conductor lines; and
(g) providing a second plurality of conductive vias through said dielectric substrate between respective ones of said second terminals and said conductor lines.

15. A method according to claim 14, wherein steps (f) and (g) comprise forming first and second pluralities of vias and electroplating metal therein.

16. A method according to claim 14 wherein conductor lines comprise soft copper and terminals comprise beryllium copper.

17. A method according to claim 14, wherein said conductor lines and said dielectric substrate are flexible.

18. A method of manufacturing an electrical interconnect structure comprising the steps of:
(a) providing a laminate structure comprised of an insulating substrate, a first conductor layer of a first thickness disposed on a first surface of said insulating substrate, and a second conductor layer of a second thickness disposed on a second surface of said insulating substrate, said first thickness being greater than said second thickness;
(b) forming a window through said second conductor layer and said insulating substrate;
(c) providing a plurality of conductive vias through aid laminate structure adjacent to said window, so as to electrically interconnect said first and second conductor layers through said insulating substrate;
(d) selectively patterning said first conductor layer down to said first surface of said insulating substrate into a conductor terminal at said first portion of said first surface of said insulating substrate, said first conductor terminal having a tongue portion that overlies said window; and (e) selectively patterning said second conductor layer down to said second surface of said insulating substrate into an interconnect track extending to said window.

19. A method according to claim 18, further including the step of: (f) severing said laminate structure beyond an outer edge of said window, thereby leaving said electrical interconnect structure in the form of said insulating substrate having said first conductor terminal at said first portion of said first surface of said insulating substrate, such that said tongue portion of said first conductor terminal extends beyond an outer edge of said insulating substrate, and said interconnect track extends on said second surface of said insulating substrate to said outer edge of said insulating substrate.

20. A method according to claim 19, wherein said insulating substrate comprises a flexible dielectric layer, and said second conductor layer comprises a flexible conductor layer.

21. A method according to claim 18, wherein said first and conductor layers are formed of metallic layers having dissimilar rigidity characteristics.

22. A method of manufacturing an electrical interconnect structure comprising the steps of:

(a) providing a laminate structure comprised of an insulating substrate, a first conductor layer of a first thickness disposed on a first surface of said insulating substrate, and a second conductor layer of a second thickness disposed on a second surface of said insulating substrate, said first thickness being greater than said second thickness;

(b) forming first and second windows at spaced apart portions of said laminate structure through said second conductor layer and said insulating substrate;

(c) providing respective first and second pluralities of conductive vias through said laminate structure adjacent to first and second windows, so as to electrically interconnect first and second spaced apart portions of said first and second conductor layers through said insulating substrate;

(d) selectively patterning said first conductor layer down to said first surface of said insulating substrate into first and second conductor terminals at said first and second spaced apart portions thereof, said first and second conductor terminals having tongue portions that overlie extend over said first and second windows; and (e) selectively patterning said second conductor layer down to said second surface of said insulating substrate into an interconnect track extending between said first and second windows.

23. A method according to claim 22, further including the step of: (f) severing said laminate structure beyond outer edges of said first and second windows, thereby leaving said electrical interconnect structure in the form of said insulating substrate having said first and second conductor terminals at said first and second spaced apart portions of said first surface of said insulating substrate, such that the tongue portions of said first and second conductor terminals extend beyond outer edges of said insulating substrate, and said interconnect track extends on said second surface of said insulating substrate between said outer edges of said insulating substrate.

24. A method according to claim 23, wherein said insulating substrate comprises a flexible dielectric layer, and said second conductor layer comprises a flexible conductor layer.

25. A method according to claim 22, wherein said first and second conductor layers are formed of metallic layers having dissimilar rigidity characteristics.

* * * * *